United States Patent
Wieduwilt et al.

(10) Patent No.: US 11,450,388 B2
(45) Date of Patent: Sep. 20, 2022

(54) DYNAMIC TRIM SELECTION BASED ON OPERATING VOLTAGE LEVELS FOR SEMICONDUCTOR DEVICES AND ASSOCIATED METHODS AND SYSTEMS

(71) Applicant: Micron Technology, Inc., Boise, ID (US)

(72) Inventors: Christopher G. Wieduwilt, Boise, ID (US); James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/158,490

(22) Filed: Jan. 26, 2021

(65) Prior Publication Data
US 2022/0238166 A1    Jul. 28, 2022

(51) Int. Cl.
| | |
|---|---|
| *G11C 16/10* | (2006.01) |
| *G11C 16/30* | (2006.01) |
| *G11C 7/10* | (2006.01) |
| *G11C 16/32* | (2006.01) |
| *G11C 16/34* | (2006.01) |
| *G11C 16/26* | (2006.01) |

(52) U.S. Cl.
CPC ............. *G11C 16/30* (2013.01); *G11C 7/106* (2013.01); *G11C 7/1087* (2013.01); *G11C 16/10* (2013.01); *G11C 16/26* (2013.01); *G11C 16/32* (2013.01); *G11C 16/3404* (2013.01)

(58) Field of Classification Search
CPC ....... G11C 16/30; G11C 7/106; G11C 7/1087; G11C 16/10; G11C 16/26; G11C 16/32; G11C 16/3404
See application file for complete search history.

(56) References Cited

U.S. PATENT DOCUMENTS

| | | | |
|---|---|---|---|
| 2006/0274594 A1* | 12/2006 | Huckaby ................ | G11C 16/20 365/226 |
| 2009/0049348 A1* | 2/2009 | Iwai ....................... | G11C 29/08 714/E11.177 |

* cited by examiner

*Primary Examiner* — Xiaochun L Chen
(74) *Attorney, Agent, or Firm* — Perkins Coie LLP

(57) ABSTRACT

Dynamic trim selection based on operating voltage levels for semiconductor devices and associated methods and systems are disclosed. Certain semiconductor devices are expected to operate under two or more operating voltage levels. In some embodiments, the semiconductor device can be characterized to determine optimum timing and/or voltage conditions across multiple operating voltage levels. Consequently, multiple sets of timing and/or voltage conditions can be identified depending on the operating voltage levels, which can be stored in a non-volatile memory (NVM) array of the semiconductor device. During operation, the semiconductor device can determine the operating voltage level currently supplied to the semiconductor device and select one of the timing and/or voltage conditions stored in the NVM array such that the semiconductor device can operate with the optimum timing and/or voltage conditions that has been predetermined for the semiconductor device operating under the operating voltage level.

17 Claims, 5 Drawing Sheets

DYNAMIC TRIM SELECTION BASED ON OPERATING VOLTAGE LEVELS FOR SEMICONDUCTOR DEVICES AND ASSOCIATED METHODS AND SYSTEMS

TECHNICAL FIELD

The present disclosure generally relates to semiconductor devices, and more specifically, relates to dynamic trim selection based on operating voltages for semiconductor devices and associated methods and systems.

BACKGROUND

Semiconductor devices are widely used to process information related to various electronic devices such as computers, wireless communication devices, cameras, digital displays, and the like. Certain semiconductor devices are used to store the information—e.g., memory devices. Memory devices may be volatile or non-volatile and can be of various types, such as magnetic hard disks, random access memory (RAM), read only memory (ROM), dynamic RAM (DRAM), synchronous dynamic RAM (SDRAM), and others. Information is stored in various types of RAM by charging a memory cell to have different states. Improving RAM memory devices, generally, can include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
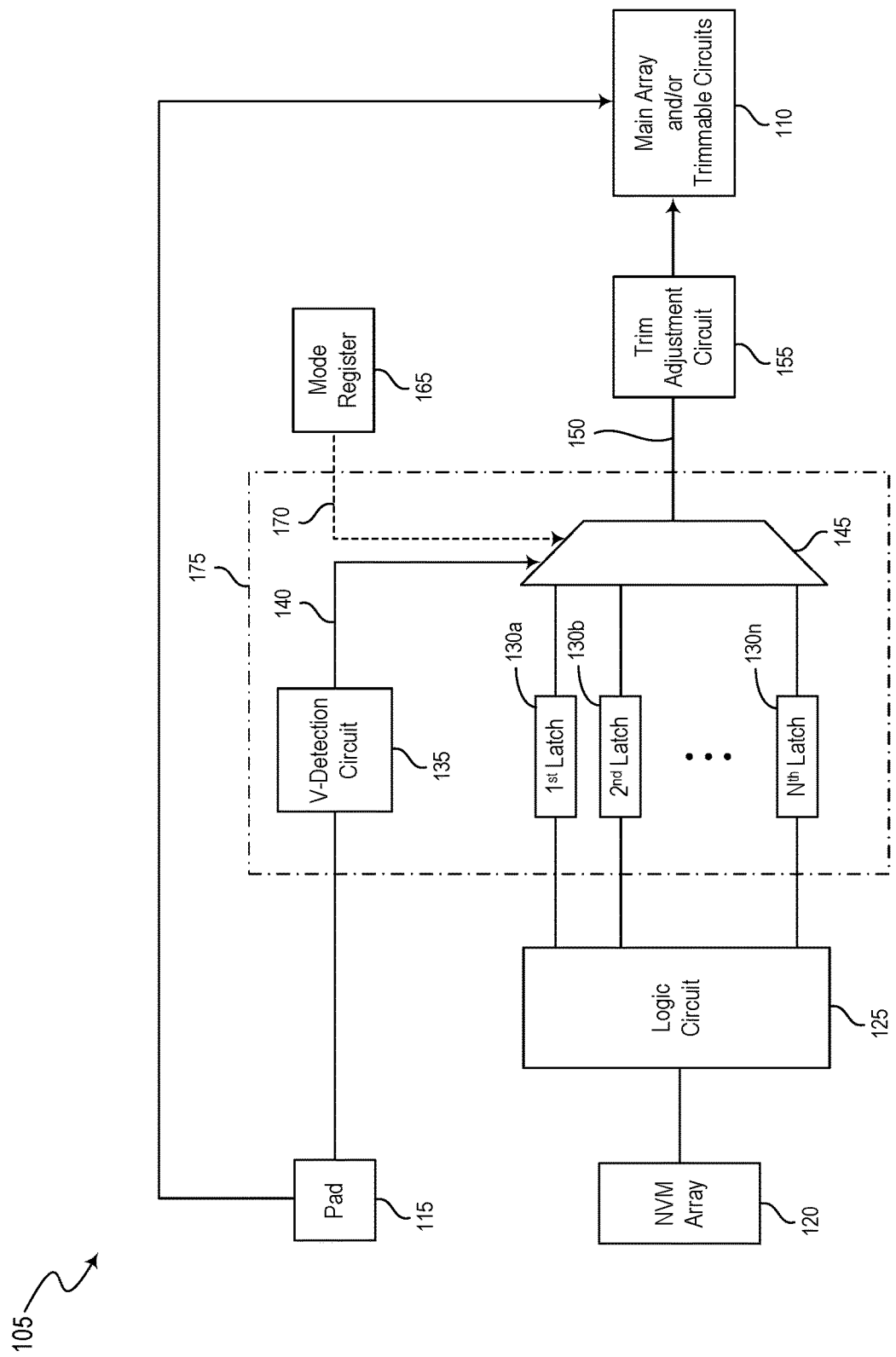
FIG. 1 is a block diagram of a memory device illustrating various components for dynamic trim selection based on operating voltage levels in accordance with embodiments of the present disclosure.

For certain high performance memory systems, power consumption increases as speed rates for the systems increase. The increased power consumption typically leads to increased operating temperatures for the memory devices (e.g., DRAMs) in the systems. To satisfy thermal boundaries for the memory devices, it would be desirable to reduce or maintain the power consumption while delivering the increased speed rates. To that end, the memory devices may include higher performance complementary metal-oxide-semiconductor (CMOS) components and/or circuits capable of satisfying the speed rates at a reduced operating voltage. The memory devices, however, may also operate under an operating voltage specified by an industry specification (e.g., specifications announced by Joint Electronic Device Engineering Council (JEDEC)), which may be higher than the reduced operating voltage. Consequently, the memory devices may be expected to operate under a wide range of voltages (voltage levels, voltage values) for their operating voltages (VDD, VDD1, VDD2, VDD2L).

By way of example, for certain applications (e.g., applications in which memory devices are deployed as individual components), the memory devices may be supplied with an operating voltage (VDD) of approximately 1.1V (e.g., 1.1V+6%, 1.1V−3%). For other applications (e.g., applications in which multiple memory devices collectively operate as a memory module having a power management component), the memory devices may be supplied with VDD of approximately 1.0V±3% (e.g., through the power management component). As such, a total window of voltage levels of VDD for the memory devices can range between 0.97V to 1.166V. In some cases, certain customers may want to operate the memory devices (e.g., as individual components) with operating voltages (e.g., one or more of VDD, VDD1, VDD2, VDD2L) at voltage levels preferred for their applications, which may be different than the specification. Further, the total window of voltage levels of VDD may be even greater for memory devices manufactured with advanced process technology nodes, which could be designed to operate with even lower operating voltages (e.g., 0.8V or even less), if such memory devices are deployed in the applications operating with greater operating voltages (e.g., 1.0V, 1.1V).

It would be difficult to maintain the memory devices to optimally perform over such a wide range of voltage levels of the operating voltage (VDD) because the memory devices includes various circuits and functional blocks that are sensitive to the voltages of VDD (e.g., VDD levels, VDD values). For example, an area of extreme sensitivity to the VDD levels includes operations associated with memory arrays of the memory devices, such as circuits controlling timing requirements associated with row-paths (e.g., while executing Activate commands or Precharge commands), column-paths (e.g., while performing column select operation), data-paths (e.g., while maintaining data setup and/or hold timings), or the like. Additionally, the memory devices may include other circuits and functional blocks that requires extensive "training" procedures to identify an optimum set of timing and/or voltage conditions, such as command bus training, read DQ calibration and/or training, or the like.

When the memory devices are tested (e.g., probe tests), a set of timing and/or voltage conditions can be carefully tailored (e.g., fine-tuned, trimmed) for the performance critical, VDD-sensitive circuits described above to guarantee the memory devices to optimally perform under a particular VDD level (e.g., a particular voltage level designated by the JEDEC specifications) or a relatively narrow range of VDD levels including the particular VDD level. The set of fine-tuned timing and/or voltage conditions may be referred to as a trim condition. The trim condition determined under the particular VDD level (or under the narrow range of VDD levels), however, is unlikely to guarantee the memory device to optimally perform under a different VDD level. Further, maintaining multiple test procedures (test programs, test flows) that each aims to optimize performance of the memory devices at a particular VDD level would be costly. Additionally, managing inventories of the memory devices after having them differently trimmed to different VDD levels would add to the cost.

To address foregoing issues and challenges, embodiments of the present disclosure provide schemes for dynamic trim selection based on operating voltage levels for memory devices. While a memory device is probed (e.g., during test procedures or probe tests), the memory device can be characterized across multiple ranges of voltage levels, under which the memory device could operate (e.g., the total window of voltage levels of VDD, multiple customer preferred voltage levels). In some embodiments, such multiple ranges of voltage levels may account for the entire range (window) of voltage levels of the operating voltage (e.g., across entire VDD levels). In other words, multiple sets of trim conditions can be determined based on multiple ranges (sub-ranges) of the voltage levels that correspond to the entire range in aggregate. In some embodiments, the multiple ranges of voltage levels do not overlap each other. Each trim condition can be represented as a trim code having a certain quantity of bits (e.g., 2 bits, 3 bits, 4 bits, 5 bits). As such, a plurality of trim codes can be generated during the probe tests, where each trim code of the plurality corresponds to one of multiple ranges of voltage levels of the operating voltage. The trim codes can be stored (programmed) in a non-volatile memory (NVM) array of the memory device—e.g., in an array of fuses (or anti-fuses).

During operations of the memory device (e.g., initialization procedures, power-up sequences), the memory device retrieves (e.g., reads) the trim codes from the NVM array and stores them in one or more internal latches (e.g., registers, special purpose memory arrays). Further, the memory device can determine that the VDD level supplied to the memory device is within one of the multiple ranges of voltage levels. To that end, in some embodiments, the memory device includes a voltage detection circuit configured to detect the voltage level of the operating voltage (the VDD level). In other embodiments, the memory device includes a mode register configured to store an indication of the voltage level of the operating voltage. Based on determining the voltage level supplied to the memory device as its operating voltage, the memory device can select one of the trim codes stored in the internal latches. Subsequently, the memory device can transmit the selected trim code to a trim adjustment circuit of the memory device configured to adjust a set of timing and/or voltage conditions for one or more trimmable circuits of the memory device (e.g., the performance critical, VDD-sensitive circuits) according to the selected trim code.

In this manner, various trimmable circuits of the memory device can operate with the appropriate set of timing and/or voltage conditions that have been preconfigured (predetermined, preidentified) during the probe tests based on the VDD levels supplied to the memory device. As a result, a single test flow (configured to characterize performance of the memory devices across the entire range of voltage levels, under which the memory devices are expected to operate) can be utilized to test the memory devices. Further, managing the inventories of the memory devices can be simplified in view of the trim codes stored in the NVM arrays of the memory devices, which can be retrieved and selected based on the actual voltage levels of the operating voltage supplied to the memory devices.

FIG. 1 is a block diagram of a memory device 105 illustrating various components for dynamic trim selection based on operating voltage levels in accordance with embodiments of the present disclosure. The memory device 105 includes a main array and/or trimmable circuits 110, which collectively represent performance sensitive circuits and/or functional blocks of the memory device 105—e.g., circuits controlling row/column-path timings of the main array, circuits associated with training the command bus of the memory device 105, etc. The main array and/or trimmable circuits 110 is coupled with a pad 115 of the memory device 105. The pad 115 can be configured to supply the operating voltage to the memory device 105 including the main array and/or trimmable circuits 110. In some embodiments, the pad 115 is configured to couple with an external voltage supply. In other embodiments, the pad 115 is configured to couple with an internal voltage supply of the memory device 105 (e.g., a charge pump, a voltage regulator).

The memory device 105 includes a non-volatile memory (NVM) array 120 configured to store a plurality of trim codes. Each trim code of the plurality corresponds to one of multiple ranges of voltage levels of the operating voltage for the memory device 105. In some embodiments, the NVM array 120 includes a fuse array including a plurality of fuses and/or anti-fuses, an array of flash memory cells, an array of phase change memory cells, or a combination thereof.

The NVM array 120 is coupled with a logic circuit 125 configured to retrieve the plurality of trim codes from the NVM array 120. Further, the logic circuit 125 is configured to transmit the plurality of trim codes to one or more internal latches 130 (also identified individually as 130a-n) of the memory device 105—e.g., during initialization procedures, power-up procedures. In some embodiments, the logic circuit 125 includes a fuse logic configured to access (e.g., program/write, read) an array of fuses (or anti-fuses) of the NVM array 120. Further, the logic circuit 125 may include a broadcast logic configured to send out (e.g., transmit, broadcast, disseminate) the information retrieved from the NVM array 120 to various functional blocks of the memory device 105 (e.g., the internal latches 130) such that the information stored in the NVM array 120 can be readily available (e.g., locally available) after completing the initialization procedures.

In some embodiments, the memory device 105 includes a voltage detection circuit 135 coupled to the pad 115. The voltage detection circuit 135 is configured to detect a voltage level present at the pad 115 (e.g., the pad voltage) as the operating voltage supplied for the memory device 105. As such, the memory device 105 can determine that the operating voltage level is within a range of voltage levels of the multiple ranges. In some embodiments, the voltage detection circuit 135 is configured to detect the pad voltage at powerup (e.g., initialization procedures, power-up sequences). Additionally, or alternatively, the voltage detection circuit 135 may be configured to detect the pad voltage periodically (e.g., during a refresh operation or other suitable periodic operations the memory device 105 performs) and/or in response to certain operations (e.g., calibrating input/output impedances (ZQ), toggling a Reset signal, exiting from power saving operation modes)—e.g., a set of predefined operations and/or events for the memory device 105. In some embodiments, the voltage detection circuit 135 can be configured to detect the pad voltage continuously. Moreover, the voltage detection circuit 135 may be configured to detect the pad voltage with a sampling rate (e.g., a detection sample rate), which may be determined based on product types of the memory device 105 and/or application purposes (e.g., high performance applications, mobile applications).

Further, the voltage detection circuit 135 can generate an output signal 140 indicating the current voltage level of the operating voltage (e.g., supply voltage, VDD level). In some embodiments, the output signal 140 indicates a multiplexor 145 coupled to the internal latches 130 as to which trim code to select among the plurality of trim code stored in the internal latches 130. In some embodiments, the voltage detection circuit 135 can be configured to provide reliable selection between two trim codes (e.g., avoiding or guarding against indeterminately oscillating (or toggling) between two trim codes) if the voltage level is very close to a threshold between two ranges of operating voltage levels—e.g., when the operating voltage level is approximately 1.0V (e.g., at a boundary of a range) as in the example described below.

For example, if the operating voltage (e.g., the pad voltage) approximately corresponds to 1.0V (e.g., within ±0.5% or less, within ±1% or less, within ±2% or less), the voltage detection circuit 135 can first determine that the pad voltage is at a higher range (e.g., VDD levels greater than or equal to 1.0V and less than 1.03V). Subsequently, the voltage detection circuit 135 maintains the first determination and would not switch the detection result to a lower range (e.g., VDD levels greater than or equal to 0.97V and less than 1.0V) until the pad voltage reduces to 0.98V or less (instead of just 2 to 3 mV below 1.0V). In other words, the voltage detection circuit 135 can be configured to stay at the current voltage range based on the detected pad voltage until changes in the pad voltage brings the operating voltage well within a different voltage range—e.g., past the range boundary by a predetermined threshold amount (e.g., 5 mV or greater, 10 mV or greater, 15 mV or greater, 20 mV or greater). In this manner, the voltage detection circuit 135 can provide a stable indication of the range of voltage levels if the detected voltage level does not vary beyond a boundary value of the range of voltage levels by more than a predetermined hysteresis threshold. In other words, the hysteresis feature requires a greater change in the pad voltage than the predetermined hysteresis threshold to overcome the reluctance of the voltage detection circuit 135 to toggle its determination such that the voltage detection circuit 135 can provide the stable indication of the range of voltage levels.

The output signal 140 of the voltage detection circuit 135 is transmitted to the multiplexor 145 such that the multiplexor 145 can select one of the trim codes stored in the internal latches 130. Each latch of the internal latches 130 stores a trim code that has been retrieved from the NVM array 120 as described herein. For example, a first latch 130*a* may store a first trim code of "001" representing a first set of timing/voltage conditions (a first trim condition) that correspond to a first range of voltage levels (e.g., VDD levels greater than or equal to 0.97V and less than 1.0V). Similarly, a second latch 130*b* may store a second trim code of "010" representing a second set of timing/voltage conditions (a second trim condition) that correspond to a second range of voltage levels (e.g., VDD levels greater than or equal to 1.0V and less than 1.03V). If the output signal 140 from the voltage detection circuit 135 indicates that the current voltage supplied to the memory device 105 corresponds to 1.01V (or directs the multiplexor 145 to select the second trim code based on determining the current voltage supplied to the memory device 105 corresponding to 1.01V), the multiplexor 145 generates (outputs) an output signal 150 containing the second trim code "010" such that a trim adjustment circuit 155 can receive the second trim code "010."

The trim adjustment circuit 155 is configured to adjust (e.g., tweak, fine-tune) a set of timing and/or voltage conditions for one or more trimmable circuits (e.g., the array and/or trimmable circuit 110) of the memory device 105, in response to receiving the trim code from the multiplexor 145. For example, if the trim adjustment circuit 155 receives the second trim code "010" from the multiplexor 145, the trim adjustment circuit 155 may adjust the one or more trimmable circuits to operate with the second set of timing/voltage conditions based on receiving the second trim code "010" received—e.g., consistent with the second trim code "010." In this manner, the memory device 105 can dynamically select a proper trim condition that has been preconfigured (e.g., during the probe tests of the memory device 105) based on determining the actual operating voltage level supplied to the memory device 105 during operation. In this regard, the voltage detection circuit 135, the internal latches 130, and the multiplexor 145 may collectively be referred to as a dynamic trim selector 175 (or peripheral circuitry) of the memory device 105.

In some embodiments, the memory device 105 includes a mode register 165, which a host device (e.g., a memory controller) operably coupled with the memory device 105 can access (read, write). As such, the host device may program the mode register 165 to indicate the voltage (e.g., 1.01V) supplied to the memory device 105 for the operating voltage (e.g., through a power management component, through an external voltage supply). The memory device 105 can determine that the operating voltage is within the range of voltage levels (e.g., VDD levels greater than or equal to 1.0V and less than 1.03V) based on the mode register 165 indicating the voltage level. Accordingly, the voltage detection circuit 135 may be omitted in such embodiments. In some embodiments, the mode register 165 provides an output 170 indicating the current voltage level at the pad 115 to the multiplexor 145. As described herein, in response to receiving the output 170, the multiplexor 145 can select (output) one of the trim codes (e.g., the second trim code "010") stored in the internal latches 130 for the trim adjustment circuit 155. In response to receiving the trim code, the trim adjustment circuit 155 adjusts the one or more trimmable circuits of the memory device 105 to operate with the appropriate timing/voltage conditions (e.g., the second set of timing/voltage conditions) consistent with the trim code received.

Although the foregoing example embodiments depict the trim code with three (3) bits for illustration purposes, the present disclosure is not limited thereto. For example, in other embodiments, the trim codes may include a different quantity of bits—e.g., 1 (1) bit, two (2) bits, four (4) bits, five (5) bits, or even greater. In some embodiments, a trim code with 1 bit may correspond to the voltage detection circuit 135 (or the mode register 165) controlling an on/off setting for a trim condition.

In some embodiments, the memory device 105 may include more than one pad (e.g., the pad 115) configured to supply operating voltages to the memory device 105. For example, the memory device 105 may include an additional pad (e.g., a second pad) configured to supply an operating voltage different than the one distributed by the pad 115 (e.g., a first pad), for example, to different functional blocks of the memory device 105. In such embodiments, the scheme of dynamically selecting trim conditions can be applied to the additional pad by providing an additional dynamic trim selector (e.g., the dynamic trim selector 175) such that the memory device 105 can operate with optimum trim conditions based on actual voltage level present at the additional pad. In some embodiments, two or more pads (e.g., the first and second pads) can be tied together. In such cases, the pads may be coupled to a common dynamic trim selector (e.g., the dynamic trim selector 175).

In some embodiments, the pad 115 provides an operating voltage for a main array (e.g., VARY) of the memory device 105 and functional blocks coupled thereto (e.g., row decoders, column decoders, sense amplifiers). In some cases, VARY may be generated from VDD. Thus, if the range of VDD levels for the memory device 105 are wide, VARY levels would also have wide ranges, which in turn, make it extremely difficult to maintain optimum array operations across the entire ranges of the VARY levels—e.g., in view of various array operations requiring precise timing control as described above. In such embodiments, the scheme of dynamically selecting trim conditions can be applied to the VARY such that the memory device 105 can operate with optimum trim conditions based on actual voltage levels of the VARY—e.g., by providing a dynamic trim selector (e.g., the dynamic trim selector 175) to the pad providing the operating voltage for the main array (VARY).

Figure 2:
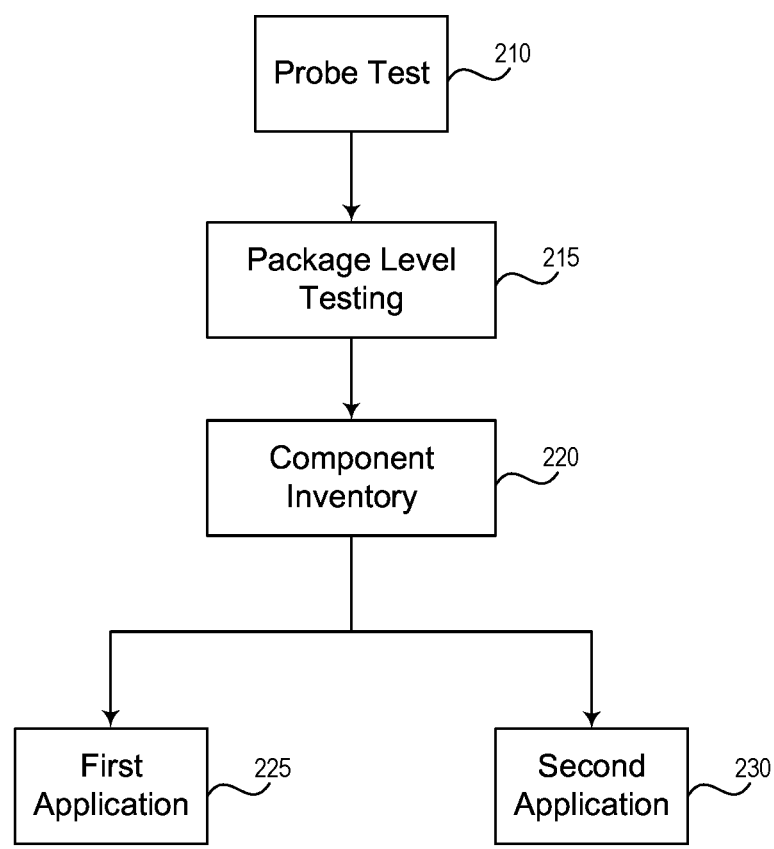
FIG. 2 is a flow diagram for dynamic trim selection based on operating voltage levels in accordance with embodiments of the present disclosure.

FIG. 2 is a flow diagram 201 for dynamic trim selection based on operating voltage levels in accordance with an embodiment of the present disclosure. The diagram may be an example of or include aspects of test procedures (test flows) for semiconductor devices (e.g., the memory device 105) configured for the dynamic trim selection as described with reference to FIG. 1. In accordance with aspects of the present disclosure, a tester (e.g., a probe station, a test equipment) may carry out the test procedures of the flow diagram 201.

At block 210, the tester characterizes the memory devices to determine (identify) multiple sets of trim conditions across the supply voltage ranges (e.g., different VDD levels). For example, the tester may apply a first voltage (e.g., 0.99V) to the memory device for its operating voltage to determine a first set of timing and/or voltage conditions for one or more trimmable circuits of the memory device to operate under the first voltage. The tester can generate a first trim code (e.g., "001") representing the first set of timing and/or voltage conditions (the first trim condition), and store the first trim code in an NVM array of the memory device—e.g., the first trim code being blown into an array of fuses of the memory device.

Subsequently, the tester may apply a second voltage (e.g., 1.01V) to the memory device for its operating voltage to determine a second set of timing and/or voltage conditions for the one or more trimmable circuits of the memory device to operate under the second voltage. The tester can generate a second trim code (e.g., "010") representing the second set of timing and/or voltage conditions (the second trim condition), and store the second trim code in the NVM array of the memory device—e.g., the second trim code being blown into the array of fuses. In some embodiments, the entire supply voltage range may be segmented (divided) into a plurality of ranges (sub-ranges) such that a first range of the plurality (e.g., 0.97V to 1.0V) includes the first voltage (e.g., 0.99V), and a second range of the plurality (e.g., 1.0V to 1.03V) includes the second voltage (e.g., 1.01V). In this manner, the tester can determine multiple trim conditions to optimize performance of the memory device across the entire supply voltage range. The test procedures corresponding to block 210 may be referred to as probe tests—e.g., a probe station may test the memory devices using probes landing on the memory devices.

At block 215, the memory devices are packaged and tested again to confirm the multiple trim conditions determined based on different voltage levels of the operating voltage. In some cases, the trim conditions may be further fine-tuned to guarantee optimum performance of the packaged memory devices. After confirming the trim conditions for the packaged memory device, the tester brings the packaged memory devices to a component inventory stage (block 220), where the packaged memory devices are ready to be shipped.

At block 225, the memory devices may be delivered for a first application, in which the memory devices are deployed as individual components. The memory devices may be supplied with VDD of approximately 1.1V (e.g., as specified by the JEDEC specifications). As described herein, the memory devices may determine that the operating voltage level corresponds to 1.1V (e.g., through the voltage detection circuit 135 or the mode register 165) and select the appropriate trim code corresponding to 1.1V of VDD such that one or more trimmable circuits of the memory device can operate with the optimum timing and/or voltage conditions that have been determined (preconfigured) during the probe tests.

Similarly, at block 230, the memory devices may be deployed in a second application, in which multiple memory devices collectively operate as a memory module having a power management component. The memory devices may be supplied with VDD of approximately 1.0V (e.g., through the power management component). As described herein, the memory devices may determine that the operating voltage level corresponds to 1.0V (e.g., through the voltage detection circuit 135 or the mode register 165) and select the appropriate trim code corresponding to 1.0V of VDD such that one or more trimmable circuits of the memory devices can operate with the optimum timing and/or voltage conditions that have been determined during the probe tests.

In this manner, the scheme of dynamic trim selection facilitates maintaining a single test flow despite multiple levels of the operating voltage supplied to the memory devices. Further, the scheme of dynamic trim selection enables a unified inventory management at least partially due to the multiple trim codes stored in the NVM array of the memory devices. Although the foregoing example embodiments of FIG. 2 depict two different applications for illustration purposes only (e.g., the individual component level applications, the memory module level applications), the present disclosure is not limited thereto. For example, in some cases, the memory devices may be shipped to different customers, operating the memory devices with different operating voltages (e.g., one or more of VDD, VDD1, VDD2, VDD2L at different voltage levels) preferred for their own applications. In such cases, the memory devices (e.g., through the voltage detection circuit 135 or the mode register 165) may determine actual operating voltage levels (e.g., multiple voltage levels preferred by different customers for their applications) under which the memory devices operate, such that appropriate trim conditions can be selected based on the actual operating voltages.

Figure 3:
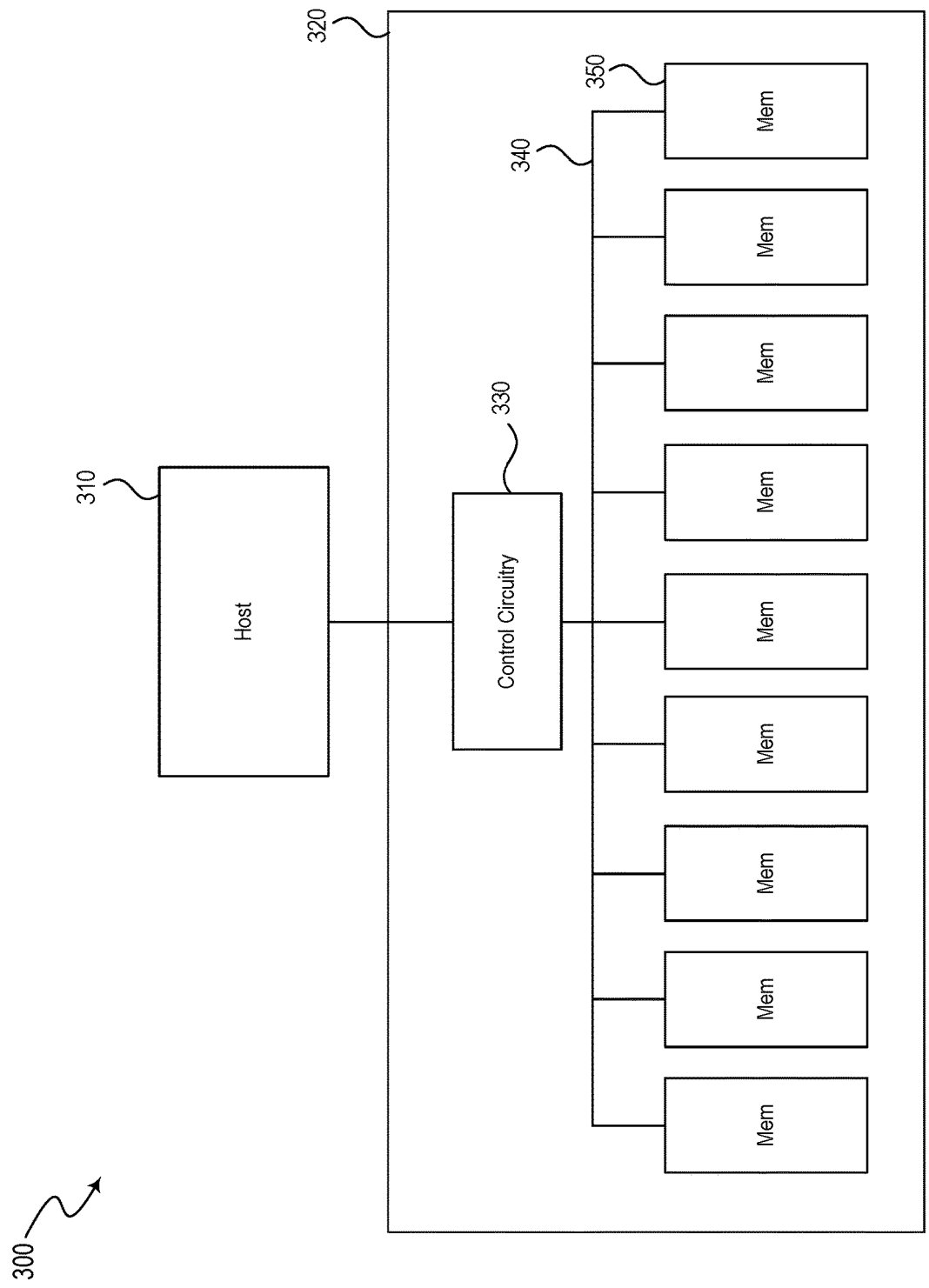
FIG. 3 is a block diagram schematically illustrating a memory system in accordance with embodiments of the present disclosure.

FIG. 3 is a block diagram schematically illustrating a memory system 300 in accordance with embodiments of the present disclosure. The memory system 300 includes a host device 310 operably coupled to a memory module 320 (e.g., a dual in-line memory module (DIMM)). The memory module 320 can include controller circuitry 330 operably connected by a bus 340 to a plurality of memory devices 350. The memory devices 350 may be examples of or include aspects of the memory device 105 described with reference to FIG. 1. In accordance with aspects of the present disclosure, the memory device 350 includes an NVM array configured to store a plurality of trim codes, where each trim code of the plurality corresponds to one of multiple ranges of voltage levels of the operating voltage for the memory device 350. Further, the memory device 350 includes peripheral circuitry (not shown, e.g., the dynamic trim selector 175) configured to determine that the voltage level of operating voltage (e.g., VDD level) is within a range of voltage levels of the multiple ranges, select a trim code of the plurality, corresponding to the range of voltage levels, and transmit the trim code to a trim adjustment circuit (not shown, e.g., the trim adjustment circuit 155) of the memory device coupled to the peripheral circuitry. Then, the trim adjustment circuit can adjust a set of timing and/or voltage conditions for one or more trimmable circuits of the memory device (e.g., the performance critical, VDD-sensitive circuits) according to the selected trim code. In this manner, the memory devices 350 can dynamically select an optimum trim condition based on the present level of the operating voltage supplied to the memory devices 350.

Figure 4:
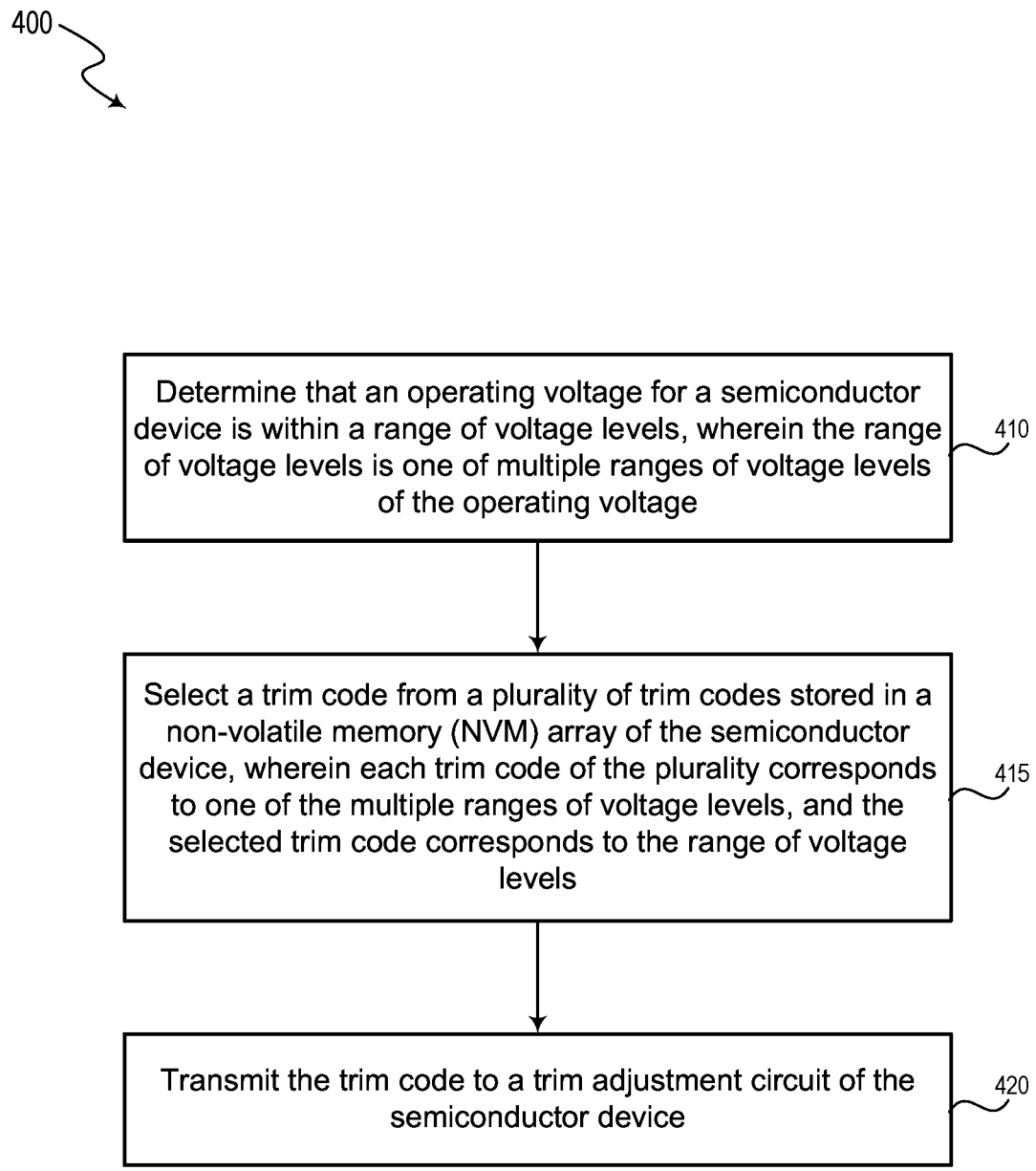
FIGS. 4 and 5 are flowcharts of methods for dynamic trim selection based on operating voltage levels in accordance with embodiments of the present disclosure.

FIG. 4 is a flowchart 400 illustrating a method of operating a semiconductor device (e.g., the memory device 105, the memory device 350) in accordance with embodiments of the present disclosure. The flowchart 400 may be an example of or include aspects of a method that the memory device 105 (or the dynamic trim selector 175 in conjunction with other components of the memory device 105) may perform as described with reference to FIGS. 1 through 3.

The method includes determining that an operating voltage for the semiconductor device is within a range of voltage levels, wherein the range of voltage levels is one of multiple ranges of voltage levels of the operating voltage (box 410). In accordance with one aspect of the present disclosure, the determining feature of box 410 can be performed by a dynamic trim selector (e.g., the dynamic trim selector 175, in conjunction with the mode register 165 in some cases) as described with reference to FIG. 1.

The method further includes, selecting a trim code from a plurality of trim codes stored in a non-volatile memory (NVM) array of the semiconductor device, wherein each trim code of the plurality corresponds to one of the multiple ranges of voltage levels, and the selected trim code corresponds to the range of voltage levels (box 415). In accordance with one aspect of the present disclosure, the selecting feature of box 415 can be performed by the dynamic trim selector 175 (in conjunction with the multiplexor 145 in some cases) as described with reference to FIG. 1.

The method further includes transmitting the trim code to a trim adjustment circuit of the memory device (box 420). In accordance with one aspect of the present disclosure, the transmitting feature of box 420 can be performed by the dynamic trim selector 175 (in conjunction with the multiplexor 145 in some cases) as described with reference to FIG. 1.

In some embodiments, the multiple ranges of voltage levels correspond to an entire range of voltage levels of the operating voltage. In some embodiments, the method may further include storing the plurality of trim codes retrieved from the NVM array in one or more internal latches of the semiconductor device, wherein selecting the trim code corresponds to selecting the trim code stored in the one or more internal latches. In some embodiments, determining that the operating voltage for the semiconductor device is within the range of voltage levels includes detecting a voltage level at a pad of the semiconductor device configured to supply the operating voltage to the semiconductor device.

In some embodiments, determining that the operating voltage for the semiconductor device is within the range of voltage levels includes receiving an indication of the voltage level from a mode register of the semiconductor device configured to store the indication of the voltage level. In some embodiments, the method may further include adjusting, at the trim adjustment circuit, a set of timing and/or voltage conditions for one or more trimmable circuits of the semiconductor device, based at least in part on receiving the trim code.

Figure 5:
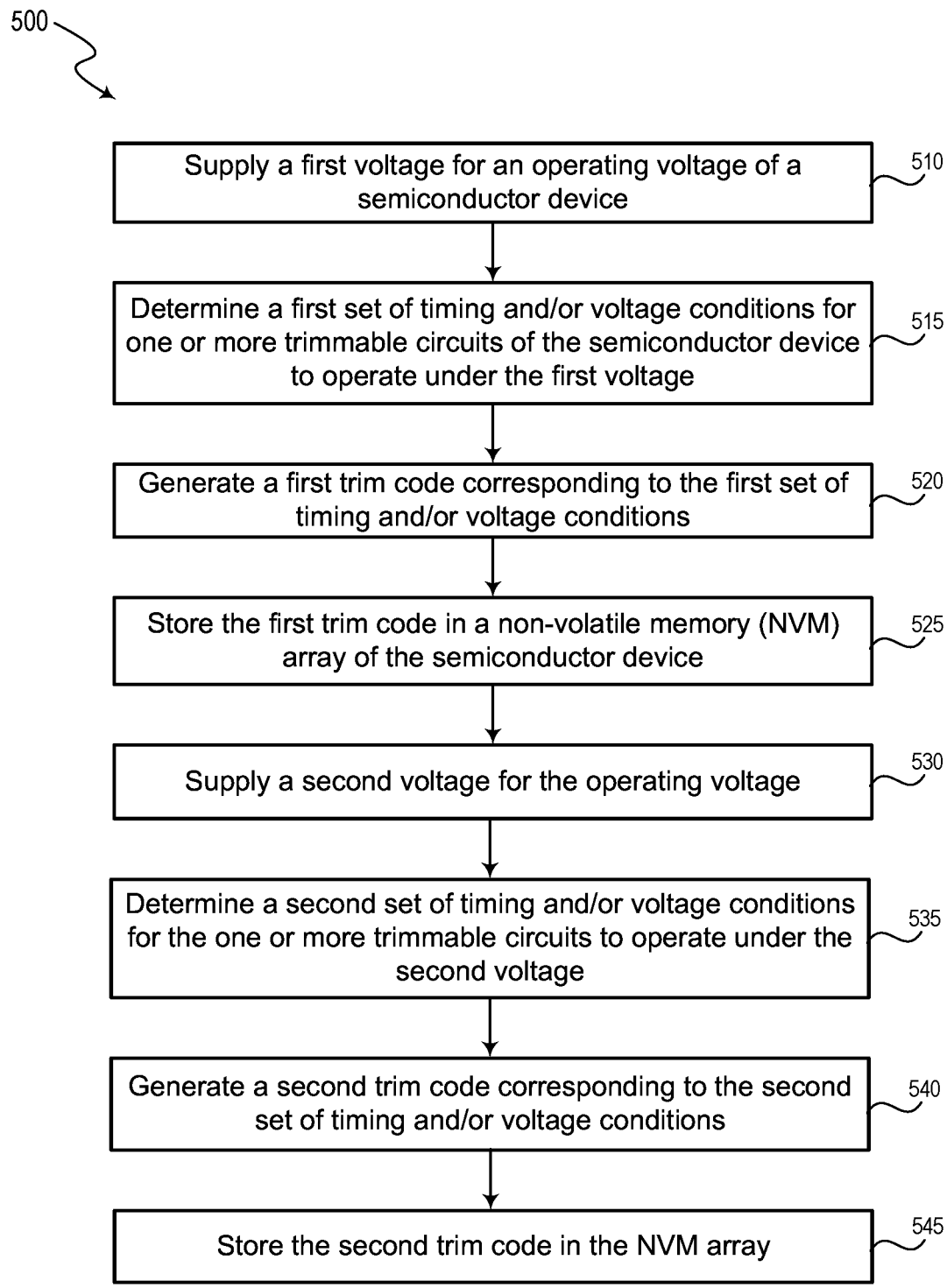

FIG. 5 is a flowchart 500 illustrating a method of testing a semiconductor device (e.g., the memory device 105, the memory device 350) in accordance with embodiments of the present disclosure. The flowchart 500 may be an example of or include aspects of the test flow described with reference to FIG. 2. In accordance with aspects of the present disclosure, a tester (e.g., a probe station, a test equipment) may carry out the features of boxes 510 through 545 as described with reference to FIG. 2.

The method includes supplying a first voltage for an operating voltage of a semiconductor device (box 510). The method further includes determining a first set of timing and/or voltage conditions for one or more trimmable circuits of the semiconductor device to operate under the first voltage (box 515). The method further includes generating a first trim code corresponding to the first set of timing and/or voltage conditions (box 520). The method further includes storing the first trim code in a non-volatile memory (NVM) array of the semiconductor device (box 525). The method further includes supplying a second voltage for the operating voltage (box 530). The method further includes determining a second set of timing and/or voltage conditions for the one or more trimmable circuits to operate under the second voltage (box 535). The method further includes generating a second trim code corresponding to the second set of timing and/or voltage conditions (box 540). The method further includes storing the second trim code in the NVM array (box 545).

In some embodiments, the method may further include supplying a third voltage for the operating voltage, determining a third set of timing and/or voltage conditions for the one or more trimmable circuits to operate under the third voltage, generating a third trim code corresponding to the third set of timing and/or voltage conditions, and storing the third trim code in the NVM array. In some embodiments, a plurality of ranges of voltage levels for the operating voltage corresponds to an entire range of voltage levels for the operating voltage, the first voltage is included in a first range of voltage levels of the plurality, and the second voltage is included in a second range of voltage levels of the plurality. In some embodiments, individual ranges of voltage levels of the plurality do not overlap each other.

It should be noted that the methods described above describe possible implementations, and that the operations and the steps may be rearranged or otherwise modified and that other implementations are possible. Furthermore, embodiments from two or more of the methods may be combined.

Those skilled in the art would appreciate that the components, blocks, and steps illustrated in FIGS. 1 through 5 described above, may be altered in a variety of ways. For example, the order of the logic may be rearranged, sub-steps may be performed in parallel, illustrated logic may be omitted, other logic may be included, etc. In some implementations, one or more of the components described above can execute one or more of the processes described below.

Information and signals described herein may be represented using any of a variety of different technologies and techniques. For example, data, instructions, commands, information, signals, bits, and symbols that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and methods presented herein are not inherently related to any particular computer or other apparatus. Various general purpose systems can be used with programs in accordance with the teachings herein, or it can prove convenient to construct a more specialized apparatus to perform the method. The structure for a variety of these systems appears as set forth in the description herein. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Reference in this specification to "implementations" or "embodiments" (e.g. "some implementations/embodiments," "various implementations/embodiments," "one implementation/embodiment," "an implementation/embodiment," etc.) means that a particular feature, structure, or characteristic described in connection with the implementation/embodiment is included in at least one implementation/embodiment of the present disclosure. The appearances of these phrases in various places in the specification are not necessarily all referring to the same implementation/embodiment, nor are separate or alternative implementations/embodiments mutually exclusive of other implementations/embodiments. Moreover, various features are described which may be exhibited by some implementations/embodiments and not by others. Similarly, various requirements are described which may be requirements for some implementations/embodiments but not for other implementations/embodiments.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

What is claimed is:

1. A semiconductor device, comprising:
    a non-volatile memory (NVM) array configured to store a plurality of trim codes, wherein each trim code of the plurality corresponds to one of multiple ranges of voltage levels of an operating voltage for the semiconductor device; and
    peripheral circuitry coupled with the NVM array, the peripheral circuitry configured to:
        determine that the operating voltage is within a range of voltage levels of the multiple ranges;
        select a trim code of the plurality, the trim code corresponding to the range of voltage levels; and
        transmit the trim code to a trim adjustment circuit of the semiconductor device coupled to the peripheral circuitry.

2. The semiconductor device of claim 1, wherein the multiple ranges of voltage levels do not overlap each other.

3. The semiconductor device of claim 1, wherein the peripheral circuitry is further configured to:
    store the plurality of trim codes retrieved from the NVM array in one or more internal latches of the semiconductor device, wherein selecting the trim code corresponds to selecting the trim code stored in the one or more internal latches.

4. The semiconductor device of claim 1, wherein the peripheral circuitry comprises a voltage detection circuit configured to detect a voltage level of the operating voltage, and wherein determining that the operating voltage is within the range of voltage levels is based, at least in part, on the voltage detection circuit detecting the voltage level.

5. The semiconductor device of claim 4, wherein the voltage detection circuit is configured to provide a stable indication of the range of voltage levels if the detected voltage level does not vary beyond a boundary value of the range of voltage levels by more than a predetermined hysteresis threshold.

6. The semiconductor device of claim 4, wherein the voltage detection circuit is coupled to a pad of the semiconductor device configured to supply the operating voltage to the semiconductor device.

7. The semiconductor device of claim 6, wherein the voltage detection circuit is configured to detect the operating voltage at the pad in response to a predefined operation executed for the semiconductor device.

8. The semiconductor device of claim 1, further comprising:
    a mode register configured to indicate a voltage level of the operating voltage, wherein determining that the operating voltage is within the range of voltage levels is based, at least in part, on the mode register indicating the voltage level.

9. The semiconductor device of claim 8, wherein a host device programs the mode register to indicate the voltage level, the host device operably coupled with the semiconductor device.

10. The semiconductor device of claim 1, wherein the trim adjustment circuit is configured to adjust a set of timing and/or voltage conditions for one or more trimmable circuits of the semiconductor device, based at least in part on receiving the trim code from the peripheral circuitry.

11. The semiconductor device of claim 10, wherein the set of timing and/or voltage conditions has been preconfigured for the one or more trimmable circuits to operate under the range of the voltage levels of the operating voltage.

12. The semiconductor device of claim 1, further comprising:
a logic circuit coupled to the NVM array, the logic circuit configured to retrieve the plurality of trim codes from the NVM array and to transmit the plurality of trim codes to one or more internal latches of the semiconductor device.

13. A method of operating a semiconductor device, comprising:
determining that an operating voltage for the semiconductor device is within a range of voltage levels, wherein the range of voltage levels is one of multiple ranges of voltage levels of the operating voltage;
selecting a trim code from a plurality of trim codes stored in a non-volatile memory (NVM) array of the semiconductor device, wherein each trim code of the plurality corresponds to one of the multiple ranges of voltage levels, and the selected trim code corresponds to the range of voltage levels; and
transmitting the trim code to a trim adjustment circuit of the semiconductor device.

14. The method of claim 13, further comprising:
storing the plurality of trim codes retrieved from the NVM array in one or more internal latches of the semiconductor device, wherein selecting the trim code corresponds to selecting the trim code stored in the one or more internal latches.

15. The method of claim 13, wherein determining that the operating voltage for the semiconductor device is within the range of voltage levels includes:
detecting a voltage level at a pad of the semiconductor device configured to supply the operating voltage to the semiconductor device.

16. The method of claim 13, wherein determining that the operating voltage for the semiconductor device is within the range of voltage levels includes:
receiving an indication of the voltage level from a mode register of the semiconductor device configured to store the indication of the voltage level.

17. The method of claim 13, further comprising:
adjusting, at the trim adjustment circuit, a set of timing and/or voltage conditions for one or more trimmable circuits of the semiconductor device, based at least in part on receiving the trim code.

* * * * *